(12) United States Patent
Matsuno (10) Patent No.: US 7,547,973 B2
(45) Date of Patent: Jun. 16, 2009

(54) TAMPER-RESISTANT SEMICONDUCTOR DEVICE

(75) Inventor: Noriaki Matsuno, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/354,331

(22) Filed: Feb. 15, 2006

(65) Prior Publication Data

US 2006/0180939 A1      Aug. 17, 2006

(30) Foreign Application Priority Data

Feb. 16, 2005   (JP) .............................. 2005-039823

(51) Int. Cl.
  *H01L 23/52* (2006.01)
  *H01L 23/48* (2006.01)
  *H01L 29/40* (2006.01)
(52) U.S. Cl. .............................. 257/773; 257/E23.142; 257/211; 257/679; 257/758; 326/8; 438/253
(58) Field of Classification Search ................. 257/773, 257/679, 922, 758, E23.142, 211, 776, 750, 257/643, 324, 326; 326/8; 365/63; 438/253
See application file for complete search history.

(56) References Cited

U.S. PATENT DOCUMENTS

| 5,168,340 | A | * | 12/1992 | Nishimura | .................... | 257/376 |
| 5,783,478 | A | * | 7/1998 | Chau et al. | .................... | 438/592 |
| 5,886,943 | A | * | 3/1999 | Sekiguchi et al. | ...... | 365/230.03 |
| 5,986,284 | A | * | 11/1999 | Kusaba et al. | .................. | 257/48 |
| 6,261,883 | B1 | * | 7/2001 | Koubuchi et al. | ........... | 438/197 |
| 6,452,283 | B2 | | 9/2002 | Smola et al. | | |
| 7,007,171 | B1 | * | 2/2006 | Butturini et al. | ............. | 713/194 |
| 2003/0001210 | A1 | * | 1/2003 | Rittaku | ........................ | 257/351 |
| 2003/0205816 | A1 | * | 11/2003 | Janke | ......................... | 257/758 |
| 2004/0004231 | A1 | * | 1/2004 | Peng et al. | .................. | 257/197 |
| 2004/0212017 | A1 | * | 10/2004 | Mizuno et al. | .............. | 257/368 |

FOREIGN PATENT DOCUMENTS

JP    2002-529928 A    9/2002
WO   WO 00/28399      5/2000

OTHER PUBLICATIONS

Mori R et al.: "Superdistribution: The Concept and the Architecture" Transactions of the Institute of Electronics, information and Communication Engineers of Japan, vol. E73, No. 7, Jul. 1990, pp. 133-146, XP002010383.*

* cited by examiner

*Primary Examiner*—Chris C Chu
(74) *Attorney, Agent, or Firm*—McDermott Will & Emery LLP (57) ABSTRACT

The semiconductor device of the present invention includes: first defensive wiring provided above a diffusion isolation layer formed in a substrate or a well, arranged at a minimum wiring pitch allowable in fabrication to cover the diffusion isolation layer; a plurality of signal wiring layers formed above the first defensive wiring; and means for applying a predetermined signal to the first defensive wiring and capturing a change in an electrical or physical property of the first defensive wiring.

13 Claims, 10 Drawing Sheets

FIG. 10
PRIOR ART though specification under 35 U.S.C. §119 on
TAMPER-RESISTANT SEMICONDUCTOR DEVICE

CROSS-REFERENCE TO RELATED APPLICATIONS

This application claims priority under 35 U.S.C. §119 on Patent Application No. 2005-39823 filed in Japan on Feb. 16, 2005, the entire contents of which are hereby incorporated by reference.

BACKGROUND OF THE INVENTION

The present invention relates to a semiconductor device provided with tamper resistance for protecting secret information inside the semiconductor device against an act of analysis by fraudulent means.

In recent years, a significantly high degree of secrecy/concealment has been increasingly required for circuit information and inside information of semiconductor devices. In particular, semiconductor devices in the field of IC cards, which are characterized in their safety, are required to protect important information therein against being subjected to fraudulent analysis and prevent inside information from being tampered or copied. In increasing cases, methods for attaining such strict protection functions have been instituted. Related prior art will be described.

Figure 9:
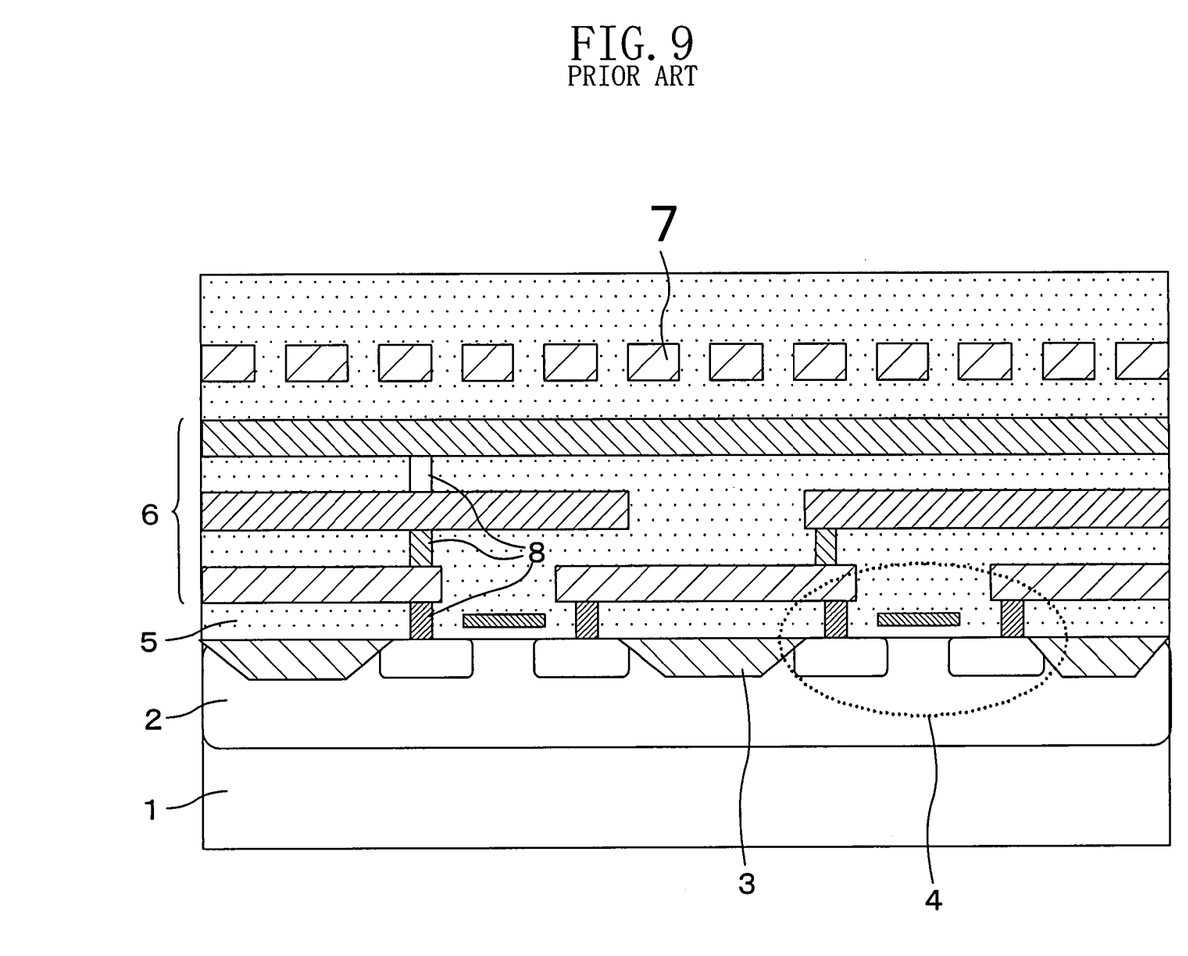
FIG. 9 is a cross-sectional view showing in schematic form part of a conventional semiconductor device having defensive wiring.

FIG. 9 shows a conventional structure of a semiconductor device, which includes a p- or n-substrate 1, a p- or n-well 2, a diffusion isolation layer 3, a transistor element formation portion 4, an insulating layer 5, signal wiring 6 to be protected, defensive wiring 7 and via contacts 8. The defensive wiring 7 is provided for protecting the signal wiring 6 against an act of analysis by fraudulent means. In general, the defensive wiring 7 is placed to cover the signal wiring 6 and may be formed from a plurality of wiring layers. The defensive wiring 7 has such a structure that makes it difficult to observe the layout pattern of the semiconductor device from the front and necessitates peeling or partial cutting of the defensive wiring 7 to reach the signal wiring 6 if analysis of the signal wiring 6 is attempted.

Generally, in a semiconductor device having a structure as described above, some pattern signal is applied at a start point of the defensive wiring 7, and simultaneously a comparison reference signal is supplied to lower-layer wiring of the defensive wiring 7, to compare the two signals at an end point of the defensive wiring 7. If the defensive wiring 7 is peeled or cut, the pattern signal does not reach a comparator, causing a difference in the comparison result. As a result, an abnormal detection signal is issued. With this abnormal detection signal, a means of protecting secret information therein operates (see Japanese National Phase PCT Laid-Open Patent Publication No. 2002-529928 (FIGS. 1 and 3), for example).

The conventional semiconductor device described above assumes fraudulent analysis means such as observation, probing, FIB machining and the like from the front, and therefore is highly tamper-resistant against acts of analysis from the front. However, with the progress of the recent FIB machining technology, there has begun to spread a technology of executing FIB machining from the back of a semiconductor device to reach target wiring and drawing a pad for probing up to the back of the semiconductor device.

Figure 10:
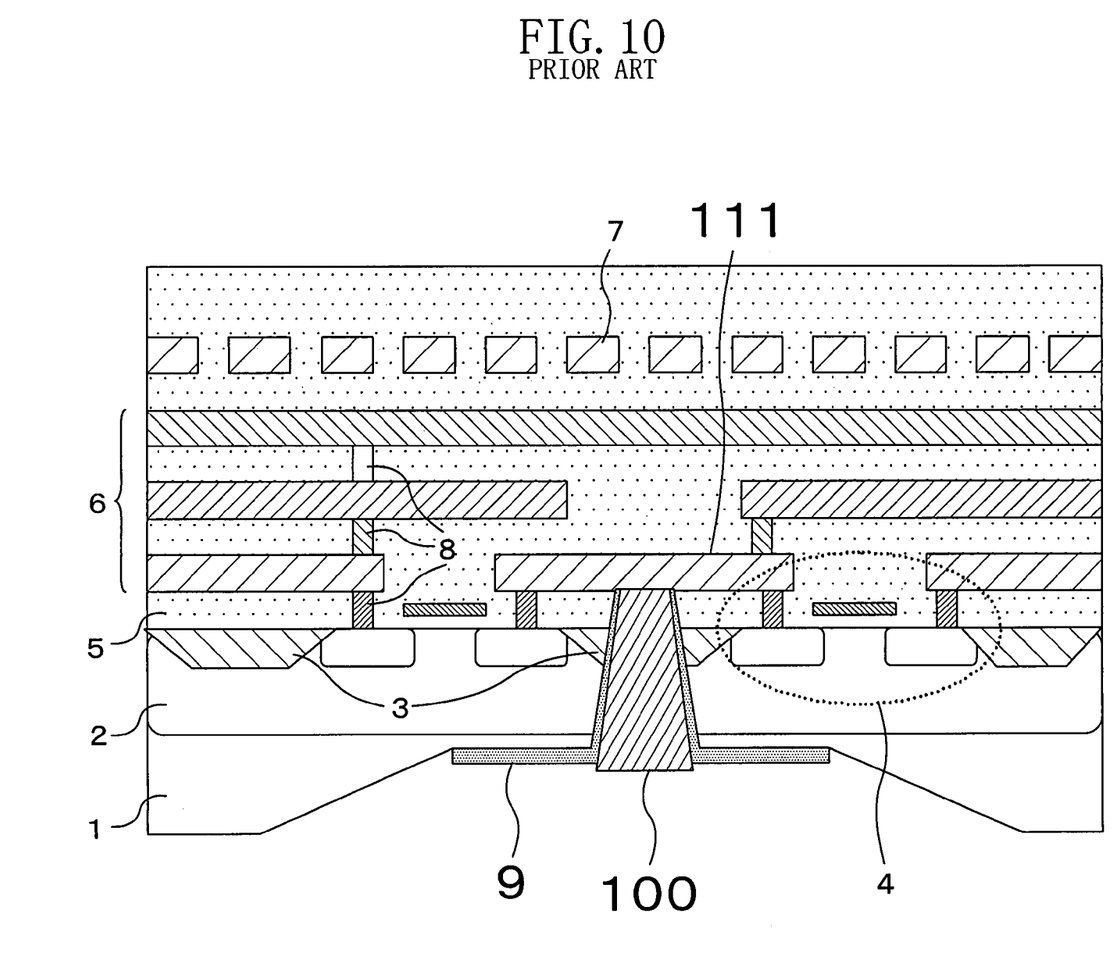
FIG. 10 is a cross-sectional view showing in schematic form part of the conventional semiconductor device having defensive wiring subjected to back FIB machining.

FIG. 10 shows a state in which an analysis pad terminal has been drawn out by FIB machining from the back of the semiconductor device. Referring to FIG. 10, in the semiconductor device including the p- or n-substrate 1, the p- or n-well 2, the diffusion isolation layer 3, the Tr element formation portion 4, the insulating layer 5, the signal wiring 6 to be protected, the defensive wiring 7, and the via contacts 8, an insulating layer 9 and an analysis pad terminal 100 are formed by FIB machining. The reference numeral 111 denotes a signal line of which analysis is intended.

First, the p- or n-substrate 1 is cut from the back surface up to a portion near the boundary between the p- or n-substrate 1 and the p- or n-well 2. A hole is then dug in the p- or n-well 2 toward the target signal line 111 placed above the diffusion isolation layer 3 by FIB machining. The insulating layer 9 is formed on the resultant hole, and then the analysis pad terminal 100 is drawn up to the back surface. The conventional semiconductor device described above is no more tamper-resistant at all against fraudulent analysis making full use of such a machining technique.

SUMMARY OF THE INVENTION

An object of the present invention is providing a semiconductor device having very high tamper resistance against fraudulent analysis attempts using FIB machining and the like from the back of the semiconductor device.

The semiconductor device of the present invention includes: one unit or a plurality of units of first defensive wiring provided above a diffusion isolation layer formed in a substrate or a well, the first defensive wiring being arranged at a minimum wiring pitch allowable in fabrication to cover the diffusion isolation layer; a plurality of signal wiring layers formed above the first defensive wiring; and means for applying a predetermined signal to the first defensive wiring and capturing a change in an electrical or physical property of the first defensive wiring.

Preferably, the semiconductor device described above further includes means for erasing secret information inside the semiconductor device or shifting the mode of the semiconductor device to a fixed mode if a change in an electrical or physical property of the first defensive wiring is captured.

According to the semiconductor device described above, the first defensive wiring will inevitably be cut to reach target wiring of which analysis is intended by means of FIB machining and the like from the back, and therefore the degree of difficulty of machining significantly increases. Moreover, with the means for applying some signal (or voltage or current) to the first defensive wiring, monitoring an electrical or physical property of the first defensive wiring and, if capturing a change in the electrical or physical property of the first defensive wiring, erasing secret information inside the semiconductor device or shifting the mode of the semiconductor device to a fixed mode, very high tamper resistance can be attained.

Preferably, in the semiconductor device described above, the plurality of signal wiring layers includes: a first signal wiring layer from which first signal wiring requiring secrecy is formed; and a second signal wiring layer placed above the first signal wiring layer, from which second signal wiring requiring no secrecy is formed, wherein the second signal wiring is arranged to cover the first signal wiring.

The semiconductor device described above has a multi-layer wiring structure to deal with fraudulent analysis by FIB machining and the like from the front. The upper wiring layer (second signal wiring layer) is placed to form signal wiring (second signal wiring) that will cause no problem if being analyzed so as to cover the lower wiring layer (first signal wiring layer), while important wiring (first signal wiring) is formed from the lower wiring layer (first signal wiring layer). With this placement, to analyze the lower wiring layer (first signal wiring layer) from the front of the semiconductor device, FIB machining of a high degree of difficulty will be required. Moreover, by providing wiring for signals enabling operation of various functions of the semiconductor device, power supply and grounding to coexist with the upper wiring (second signal wiring), the probability of peeling or breaking such wiring for signals enabling operation of functions, power supply and grounding will increase. If such wiring is peeled or broken, the semiconductor device will no more operate normally. Thus, the tamper resistance can be improved. In this way, the semiconductor device described above is provided with somewhat high tamper resistance against machining from the front without the necessity of newly placing a defensive wiring layer as the uppermost layer with expenditure of fabrication cost.

Preferably, in the semiconductor device described above, the first defensive wiring is formed from a polysilicon layer used for formation of gates of transistor elements formed in the substrate or the well.

According to the semiconductor device described above, the first defensive wiring is formed from the polysilicon layer for formation of the gates of transistors. It is therefore unnecessary to newly place a metal wiring layer dedicated to the defensive wiring, and thus makes it possible to provide the semiconductor device having high tamper resistance against fraudulent analysis from the back at further reduced fabrication cost.

Preferably, the semiconductor device described above further includes: one unit or a plurality of units of second defensive wiring provided above the plurality of signal wiring layers, the second defensive wiring being arranged at a minimum wiring pitch allowable in fabrication to cover the entire semiconductor device; and means for applying a predetermined signal to the second defensive wiring and capturing a change in an electrical or physical property of the second defensive wiring.

Preferably, the semiconductor device described above further includes: means for erasing secret information inside the semiconductor device or shifting the mode of the semiconductor device to a fixed mode if a change in an electrical or physical property of at least one of the first defensive wiring and the second defensive wiring is captured.

According to the semiconductor device described above, the front defensive wiring (second defensive wiring) is provided against fraudulent analysis from the front, while the back defensive wiring (first defensive wiring) is provided against fraudulent analysis from the back, to provide a sandwich structure in which a signal wiring network of the semiconductor device made of the middle wiring layers (the plurality of signal wiring layers) is sandwiched by the front defensive wiring (second defensive wiring) and the back defensive wiring (first defensive wiring). Some signal (or voltage or current) is applied to the front defensive wiring (second defensive wiring) and the back defensive wiring (first defensive wiring), and an electrical property of the first and second defensive wiring is monitored. If a change in the electrical or physical property of the front and back defensive wiring (first and second defensive wiring) is captured, secret information inside the semiconductor device is erased or the mode of the semiconductor device is shifted to a fixed mode.

With the above placement, it is unnecessary to divide the signal wiring (the plurality of signal wiring layers) sandwiched by the front defensive wiring (second defensive wiring) and the back defensive wiring (first defensive wiring) into signal wiring carrying important signals and the other signal wiring to allocate the divided signal wiring to different wiring layers, and thus the degree of freedom in layout design increases. Also, with the defensive wiring (first and second defensive wiring) formed above and below the signal wiring to be protected and the means for monitoring tampering, breaking and peeling of the defensive wiring, high tamper resistance can be attained.

Preferably, in the semiconductor device described above, a start point and an end point are placed in a layer from which the first defensive wiring is formed, and a wiring route connecting the start point and the end point is formed by combining the first defensive wiring and the second defensive wiring.

According to the semiconductor device described above, the upper defensive wiring (second defensive wiring) and the lower defensive wiring (first defensive wiring) of the sandwich structure are combined to establish a route for monitoring tampering, breaking and peeling, and a start point and an end point are placed in the layer forming the lower defensive wiring (first defensive wiring). With this placement, the start and end points of the monitoring route is not recognizable by layout observation from the front, and thus the tamper resistance can be significantly improved.

Preferably, in the semiconductor device described above, the wiring route of the second defensive wiring recognizable by layout observation from the front of the semiconductor device is transposed using the first defensive wiring and/or the plurality of signal wiring layers.

As described above, by transposing the route of the upper defensive wiring (second defensive wiring) by use of the lower defensive wiring (first defensive wiring), it becomes difficult to discern the correct monitoring route by layout observation even if the route of the upper defensive wiring (second defensive wiring) is formed of simple straight lines. This can lessen the burden of the layout design of the defensive wiring. Since high tamper resistance can also be attained, this placement is very effective.

Alternatively, the semiconductor device of the present invention includes a barrier diffused layer formed in a substrate or a well so that the gap between a diffused layer constituting an element and the barrier diffused layer is a minimum gap allowable in fabrication, the barrier diffused layer being of a conductivity opposite to that of the substrate or the well, a potential reverse-biased to that of the substrate or the well being applied to the barrier diffused layer.

The target for analysis from the back of the semiconductor device will be the wiring existing above a diffusion isolation layer. If the gap between the adjacent diffused layers is less than 1 μm, it is quite difficult to hole only the diffusion isolation layer by FIB machining under the currently available technology. The adjacent diffused layer constituting an element and the adjacent barrier diffused layer will also be holed. If the diffused layer of the element is holed, the element will be destroyed resulting in failure in normal circuit operation. If the barrier diffused layer is holed, the semiconductor crystal structure at the wall of the hole will be destroyed, causing a short-circuit leak between the well and the barrier diffused layer at the pn junction at the wall of the hole. Therefore, even if an analysis pad terminal is drawn out to attempt signal analysis, normal analysis will not be allowed because the semiconductor device will no more operate normally.

Preferably, the semiconductor device described above further includes: one unit or a plurality of units of defensive wiring provided above a signal wiring layer to be protected, the defensive wiring being arranged at a minimum wiring pitch allowable in fabrication to cover the entire semiconductor device; and means for applying a predetermined signal to the defensive wiring and capturing a change in an electrical or physical property of the defensive wiring.

The semiconductor device described above can maintain high tamper resistance even if the FIB technology advances in future to enable formation of a further minute hole.

According to the present invention, a semiconductor device having significantly high tamper resistance against an attempt of analysis making full use of FIB machining from the back of the semiconductor device can be provided. Also, a semiconductor device having significantly high tamper resistance against an attempt of analysis from the front, not only from the back, can be provided.

DESCRIPTION OF THE PREFERRED EMBODIMENTS

Hereinafter, preferred embodiments of the present invention will be described with reference to the accompanying drawings. Note that the same or equivalent components are denoted by the same reference numerals throughout the drawings, and description thereof is not repeated.

Embodiment 1

Figure 1:
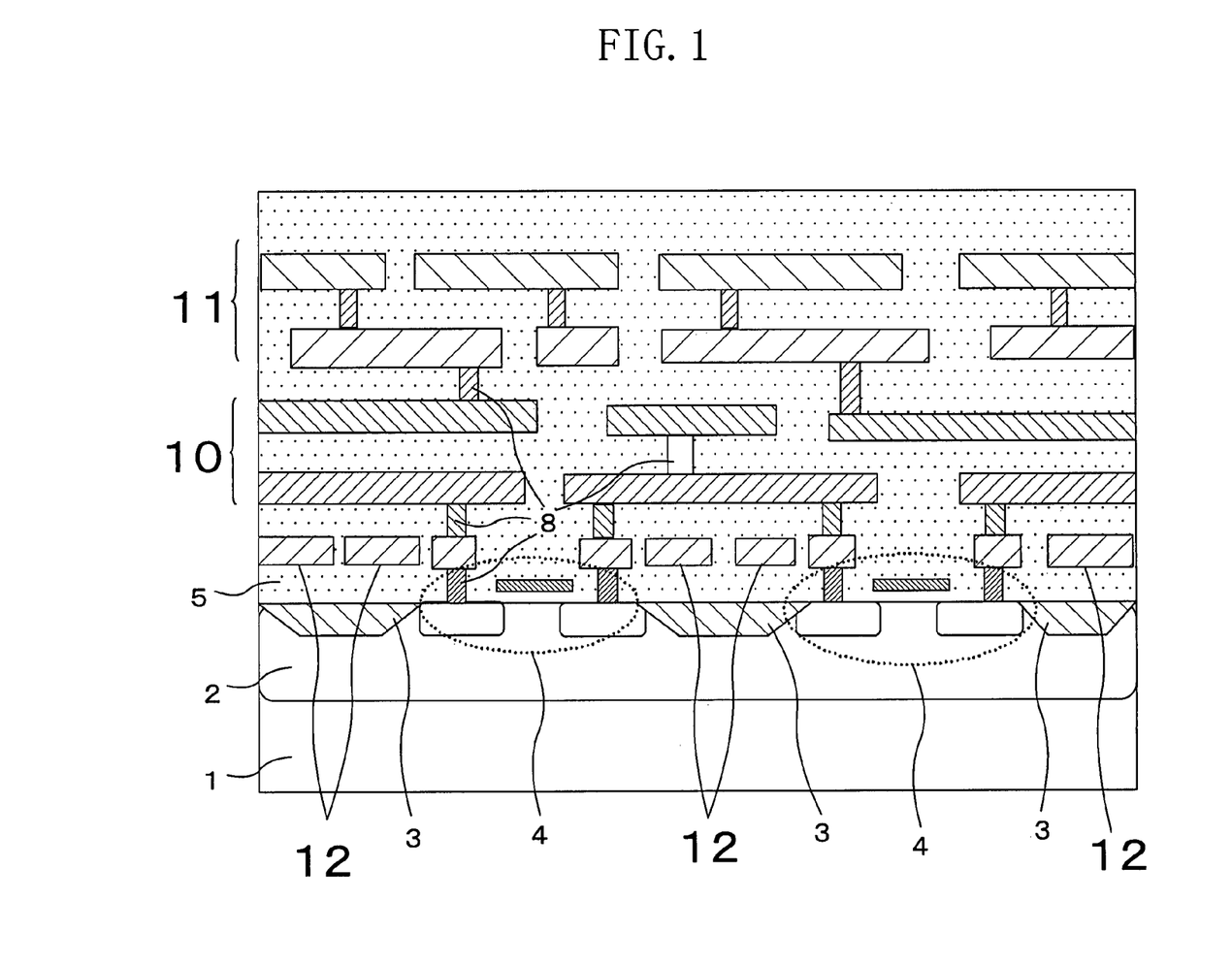
FIG. 1 is a cross-sectional view showing in schematic form part of a semiconductor device of Embodiment 1 of the present invention.

FIG. 1 shows a cross-sectional structure of a semiconductor device of Embodiment 1 of the present invention. The semiconductor device has transistor elements 4 formed on a p- or n-well 2 that is formed on a semiconductor substrate (p- or n-substrate) 1. A diffusion isolation layer 3 is formed between every adjacent transistor elements 4. Defense wiring 12 is placed above the diffusion isolation layer 3. The defensive wiring 12, which is formed from a lowermost wiring layer, is arranged to cover the region above the diffusion isolation layer 3 at the minimum wiring pitch allowable in fabrication. Above the wiring layer forming the defensive wiring 12, a signal wiring layer 10 is placed, from which signal wiring requiring secrecy (for example, data lines of a memory) is formed. A signal wiring layer 11, from which signal wiring requiring no secrecy (for example, control signal lines on a chip), is placed above the signal wiring layer 10. The signal wiring of the signal wiring layer 11 is arranged to cover the signal wiring of the signal wiring layer 10. The transistor elements 4, the defensive wiring 12 and the signal wiring of the signal wiring layers 10 and 11 are connected to one another through via contacts 8. Insulation layers 5 are formed among the transistor elements 4, the defensive wiring 12 and the signal wiring of the signal wiring layers 10 and 11.

Figure 2:
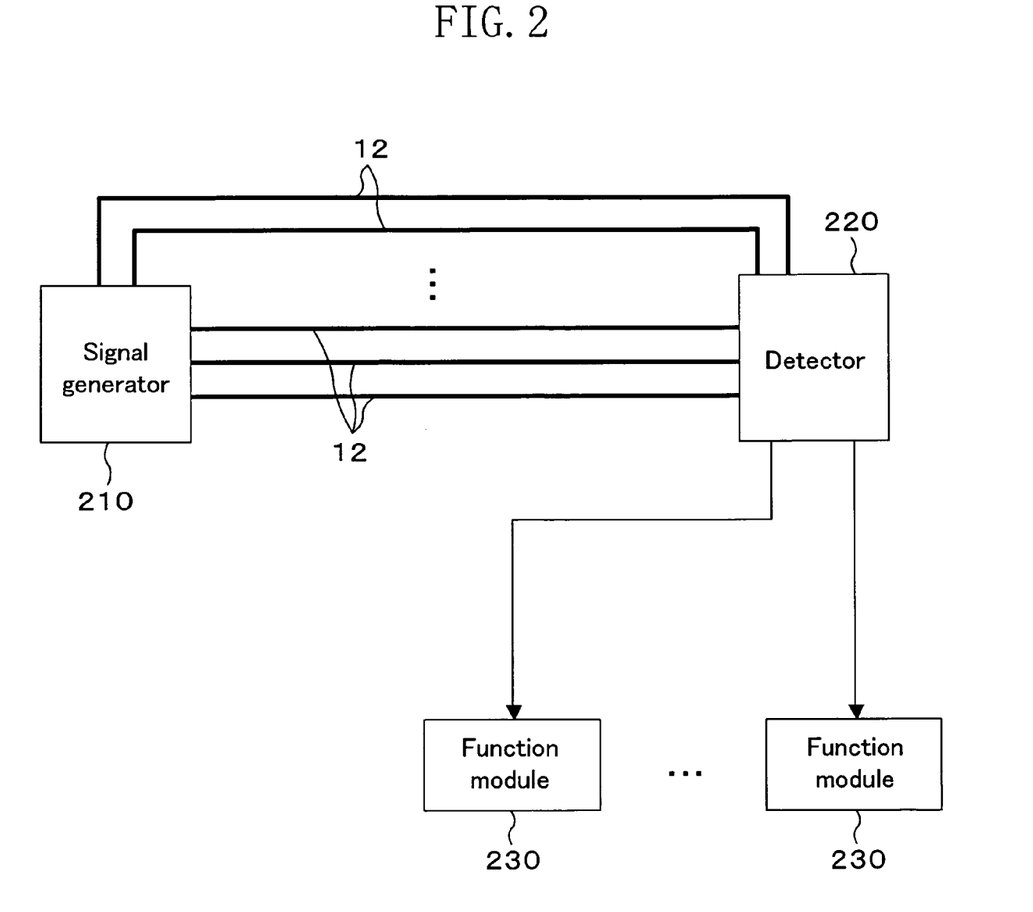
FIG. 2 is a view showing an example of implementation of a means of applying some signal, voltage or current to defensive wiring, monitoring an electrical or physical property of the defensive wiring, and if capturing a change in the electrical or physical property, erasing secret information inside a semiconductor device or shifting the mode of the semiconductor device to a fixed mode.

As described above, the semiconductor device of FIG. 1 has a multi-wiring structure, where signal wiring of which concealment is desired is formed from the lower wiring layer 10, not from the uppermost wiring layer. The signal wiring layer 11 is provided above the signal wiring layer 10, and safe signal wiring is formed from the signal wiring layer 11 so as to conceal the signal wiring of the signal wiring layer 10. Moreover, the defensive wiring 12 is formed from the lowermost wiring layer at the minimum wiring pitch allowable in fabrication to cover the region above the diffusion isolation layer 3. For the defensive wiring 12, there is provided a means of applying some signal, voltage or current to the defensive wiring 12, monitoring an electrical or physical property of the defensive wiring 12, and if capturing a change in the electrical or physical property, erasing secret information inside the semiconductor device or shifting the mode of the semiconductor device to a fixed mode. This function can be implemented by a circuit as shown in FIG. 2, for example. Circuit elements constituting a signal generator 210, a detector 220 and function modules 230 shown in FIG. 2 are formed from the transistor elements 4, and wiring connecting these elements is formed from the signal wiring layers 10 and 11. The signal generator 210 applies some signal, voltage or current to the defensive wiring 12. The detector 220 monitors an electrical or physical property of the defensive wiring 12 and, if capturing a change in the electrical or physical property, outputs a control signal to the function modules 230. In response to the control signal from the detector 220, the function modules 230 operate for preventing fraudulent analysis and information tampering attempted for the semiconductor device. For example, important data to be protected is erased from a memory, or the mode of the semiconductor device is shifted to a fixed mode.

As described above, in the semiconductor device of this embodiment, which is provided with the defensive wiring 12, it is quite difficult to reach the signal wiring of which concealment is desired (signal wiring of the signal wiring layer 10) by the FIB machining from the back of the semiconductor device without cutting the defensive wiring 12. To succeed in the FIB machining avoiding the defensive wiring 12, a very narrow region above the diffusion separation layer 3 in which the defensive wiring 12 does not run is to be holed. It is however quite difficult with the currently available technology to hole such a region without destroying any element. Thus, the semiconductor device of this embodiment has significantly high tamper resistance.

Also, the signal wiring layer 11 having signal wiring that is safe even if being analyzed is provided above the signal wiring layer 10 having signal wiring carrying secret information. Therefore, the degree of difficulty of the FIB machining from the front of the semiconductor device can be increased at low cost.

Wiring for signals enabling operation of various functions of the semiconductor device, power supply, grounding and the like may preferably be placed to coexist with the safe signal wiring formed from the signal wiring layer 11. With this placement, if the safe signal wiring is cut or peeled, such wiring for signals enabling operation of various functions of the semiconductor device, power supply and grounding will also be cut or peeled, resulting in failure in normal operation of the semiconductor device with a higher probability, and thus the effect is further enhanced.

In the above description, the transistor elements 4 and the diffusion isolation layer 3 were formed on the p- or n-well 2. Alternatively, the transistor elements 4 and the diffusion isolation layers 3 may be formed on the semiconductor substrate (p- or n-substrate).

Application of Embodiment 1

Figure 3:
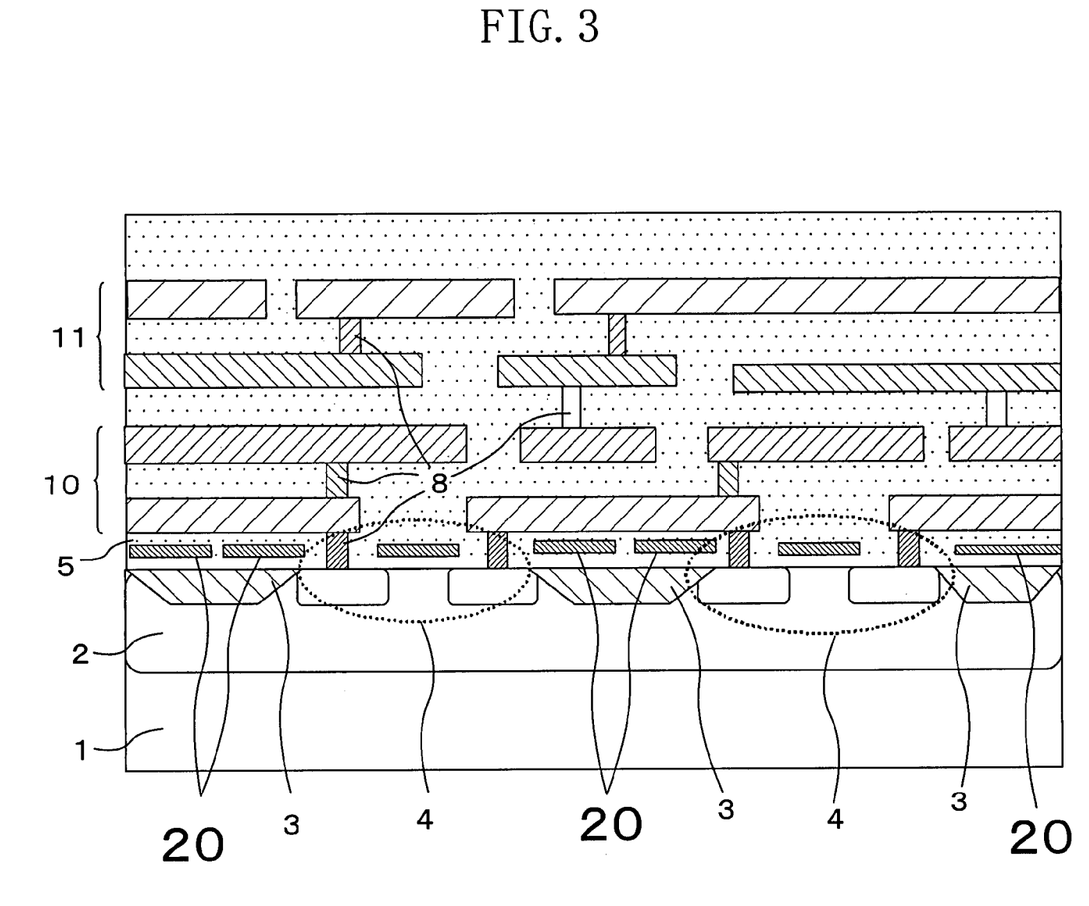
FIG. 3 is a cross-sectional view showing in schematic form part of a semiconductor device of an application of Embodiment 1 of the present invention.

FIG. 3 shows a cross-sectional structure of a semiconductor device of an application of Embodiment 1. The semiconductor device of FIG. 3 has the same structure as the semiconductor device of Embodiment 1 (FIG. 1), except that defensive wiring 20 is formed from a polysilicon layer used for formation of the gates of the MOS transistors 4. This structure makes it unnecessary to newly provide a wiring layer dedicated to the defensive wiring 20, and thus the number of fabrication steps and the fabrication cost can be reduced.

Embodiment 2

Figure 4:
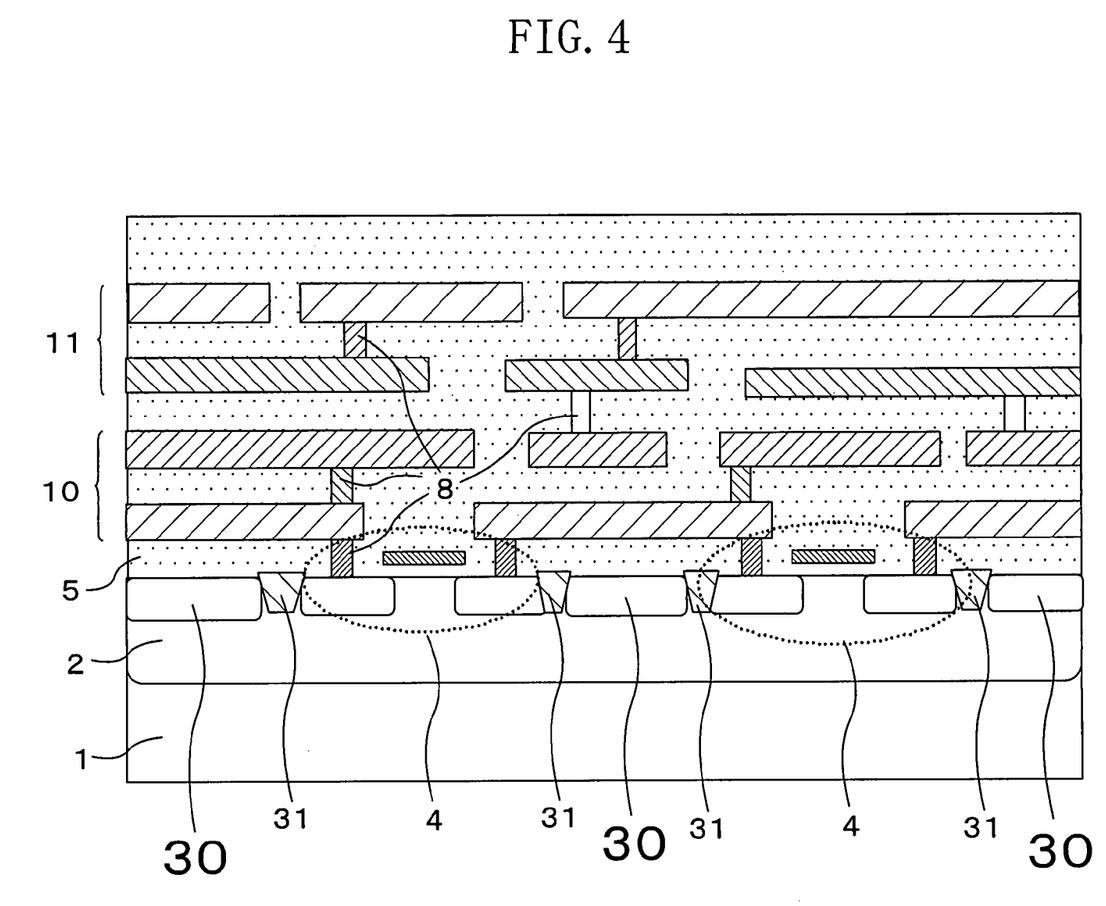
FIG. 4 is a cross-sectional view showing in schematic form part of a semiconductor device of Embodiment 2 of the present invention.

FIG. 4 shows a cross-sectional structure of a semiconductor device of Embodiment 2 of the present invention. The semiconductor device of FIG. 4 has the same multilayer wiring structure as that in Embodiment 1 against an attempt of fraudulent analysis from the front, but is provided with a barrier diffused layer 30 against an attempt of fraudulent analysis from the back, in place of the defensive wiring 12. The barrier diffused layer 30 is formed on the p- or n-well 2 with the minimum gap allowable in fabrication from the adjacent diffused layer of the transistor element formation portion 4, and has the polarity (conductivity) opposite to that of the p- or n-well 2. The barrier diffused layer 30 is also applied with a potential reverse-biased to that of the p- or n-well 2. For example, when the potential of the p- or n-well 2 is VSS, the potential VDD is applied to the barrier diffused layer 30, and vice versa.

The semiconductor device of this embodiment has the same tamper resistance as that of Embodiment 1 against FIB machining from the front. As for FIB machining from the back, it is quite difficult under the currently available technology to hole only a narrow diffusion isolation layer 31 as the minimum gap allowable in fabrication by FIB machining. Instead, the adjacent diffused layer of the transistor element formation portion 4 and the adjacent barrier diffused layer 30 will also be holed. If the diffused layer of the transistor element formation portion 4 is holed, the element will no more operate normally. If the barrier diffused layer 30 is holed, semiconductor crystal will be destroyed at the wall of the hole, causing a short-circuit leak between the p- or n-well 2 and the barrier diffused layer 30 at the pn junction of the destroyed portion. Therefore, even if an analysis pad terminal is drawn out to attempt signal analysis, normal analysis will not be allowed since the semiconductor device will no more operate normally. In this way, significantly high tamper resistance is attained.

Moreover, it is only necessary to apply a voltage reverse-biased to the potential of the p- or n-well 2 to the barrier diffused layer 30. Therefore, the semiconductor device can obtain high tamper resistance without the necessity of having the means of applying some complicated signal, voltage or current, monitoring an electrical property of the defensive wiring and, if capturing a change in the electrical property, erasing secret information inside the semiconductor device or shifting the mode of the semiconductor device to the fixed mode. Furthermore, since no wiring layer dedicated to the defensive wiring is required at all, the fabrication cost can be as low as that of a non-tamperproof semiconductor device.

Application of Embodiment 2

Figure 5:
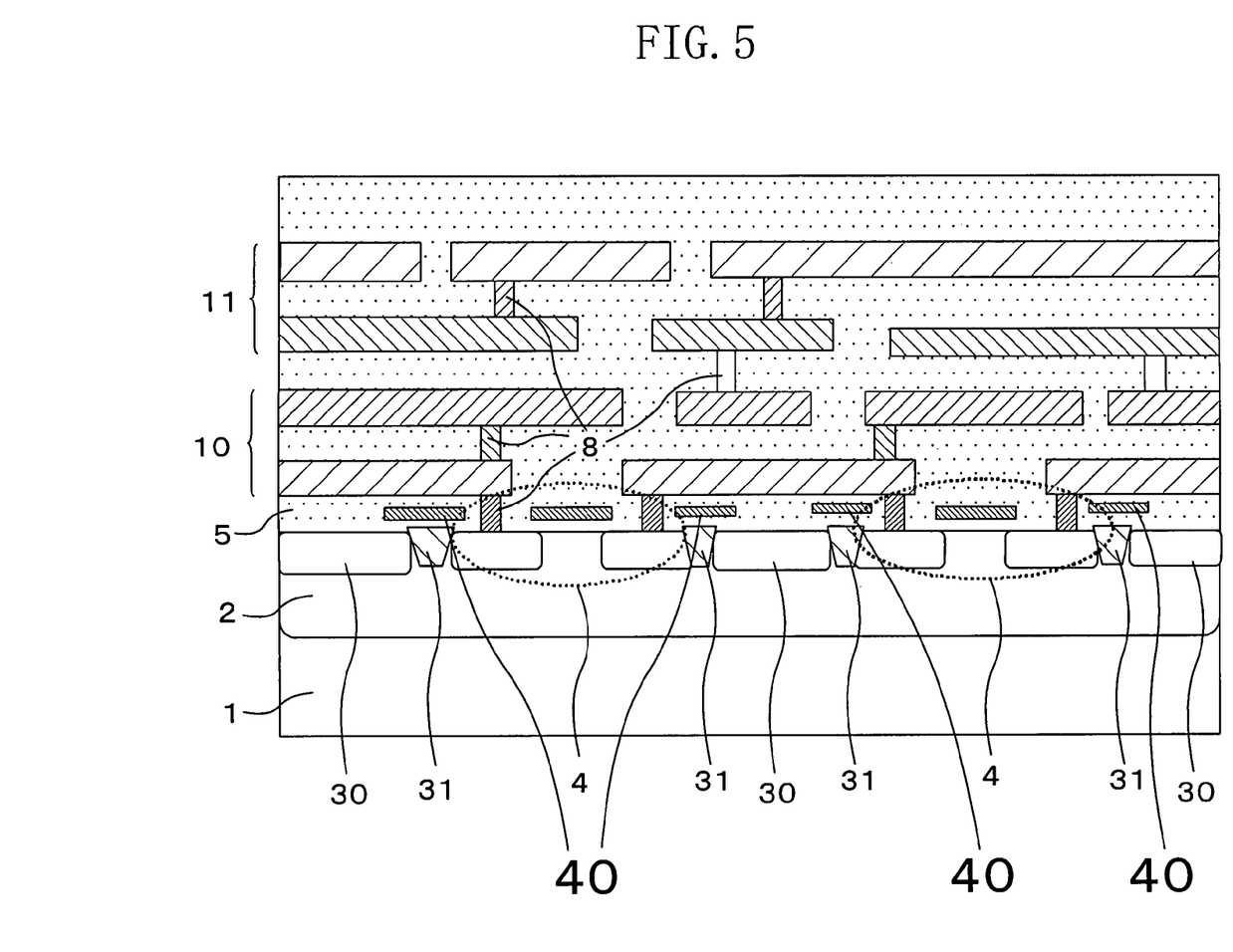
FIG. 5 is a cross-sectional view showing in schematic form part of a semiconductor device of an application of Embodiment 2 of the present invention.

FIG. 5 shows a cross-sectional structure of a semiconductor device of an application of Embodiment 2. The semiconductor device of FIG. 5 has the same structure as the semiconductor device of Embodiment 2, except that defensive wiring 40 is formed from a polysilicon layer used for formation of the gates of the MOS transistors 4. The defensive wiring 40 is arranged to be positioned above the diffusion isolation layer 31, which is narrowed to the minimum gap allowable in fabrication so that the barrier diffused layer 30 is formed, to cover the diffusion isolation layer 31. As in the case of the defensive wiring 12 in Embodiment 1, some signal, voltage or current is applied to the defensive wiring 40, and an electronic property of the defensive wiring 40 is monitored. If a change in the electronic property is captured, secret information inside the semiconductor device is erased or the mode of the semiconductor device is shifted to the fixed mode. The defensive wiring 40 may otherwise be formed from the lowermost metal wiring layer placed above the polysilicon layer.

With advance of technology, it may become possible to bore a further minute hole, and the narrow diffusion isolation layer 31 may be holed with no touch on the barrier diffused layer 30 or the diffused layer of the transistor element formation portion 4. In such an event, however, since the semiconductor device of this application is doubly protected with the defensive wiring 40, high tamper resistance can be secured against future possible advance of the FIB technology.

Embodiment 3

Figure 6:
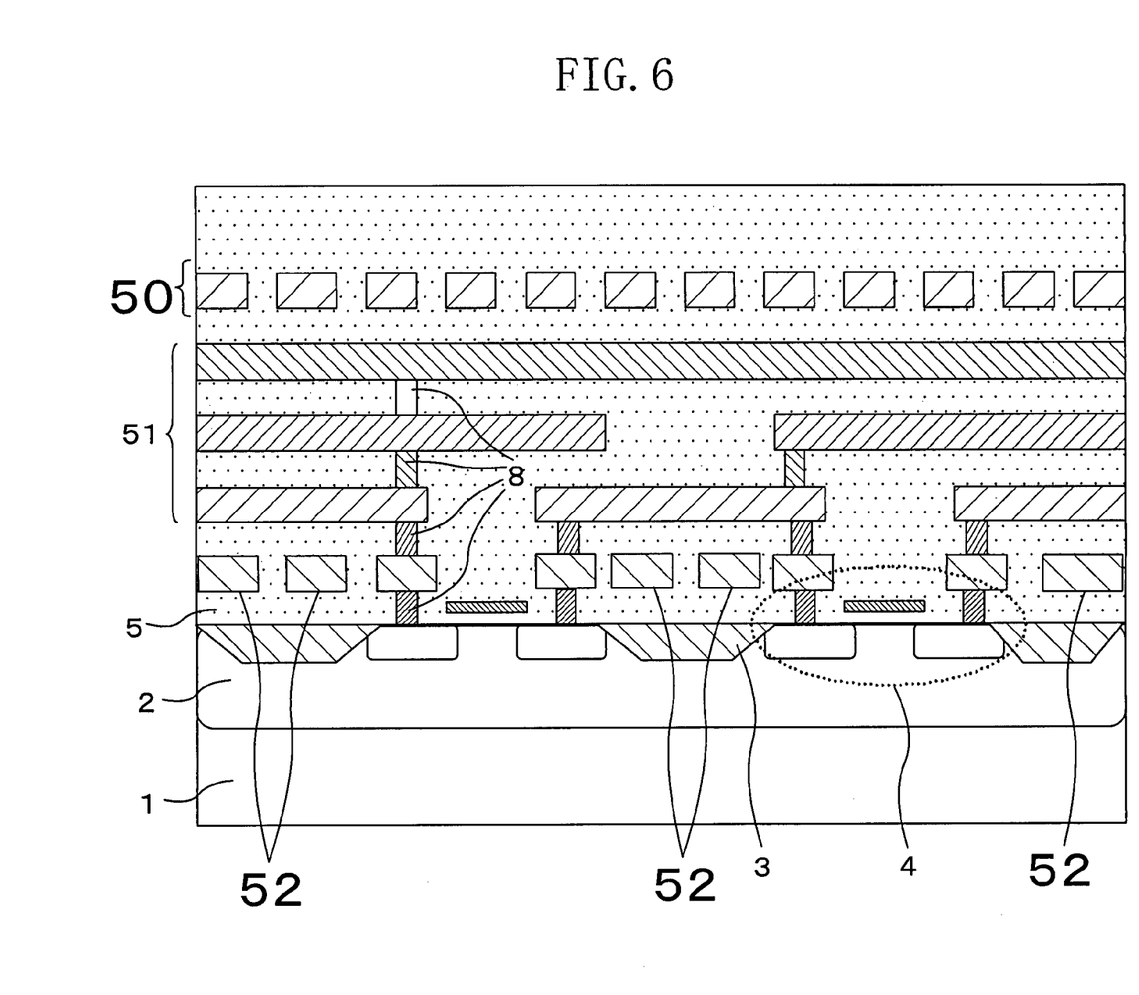
FIG. 6 is a cross-sectional view showing in schematic form part of a semiconductor device of Embodiment 3 of the present invention.

FIG. 6 shows a cross-sectional structure of a semiconductor device of Embodiment 3. The semiconductor device of FIG. 6 has a multilayer wiring structure in which front defensive wiring 50 and back defensive wiring 52 sandwich circuit wiring 51 of the semiconductor device. The front defensive wiring 50, which constitutes the uppermost wiring layer, is arranged at the minimum wiring pitch allowable in fabrication to cover all the region of the semiconductor device except for input/output pad portions. The back defensive wiring 52, which constitutes the lowermost wiring layer, is arranged at the minimum wiring pitch allowable in fabrication to cover the region above the diffusion isolation layer 3. This semiconductor device is provided with a means of applying some signal, voltage or current to the front defensive wiring 50 and the back defensive wiring 52, monitoring an electrical or physical property of the front and back defensive wiring 50 and 52 and, if capturing a change in the electrical or physical property, erasing secret information inside the semiconductor device or shifting the mode of the semiconductor device to the fixed mode. This means can be implemented by a circuit as shown in FIG. 2. The front defensive wiring 50 may be formed from a plurality of layers including the uppermost layer. The back defensive wiring 52 may be formed from the polysilicon layer.

In this embodiment, unlike Embodiments 1 and 2 described above, it is unnecessary to divide the circuit wiring 51 into signal wiring of which concealment is desired and the other signal wiring to allocate the divided signal wiring to different wiring layers. This increases the degree of freedom in layout design, lessens the burden and permits easy implementation. Also, the tamper resistance is significantly high because no FIB machining or layout observation from the front is allowed without peeling/cutting of the front defensive wiring 50 and no FIB machining from the back is allowed without cutting of the back defensive wiring 52.

To suppress the fabrication cost and other costs, the barrier diffused layer or the combination of the barrier diffused layer and the polysilicon defensive wiring, used in Embodiment 2 or the application thereof described above, may be used in place of the back defensive wiring 52.

Application 1 of Embodiment 3

Figure 7:
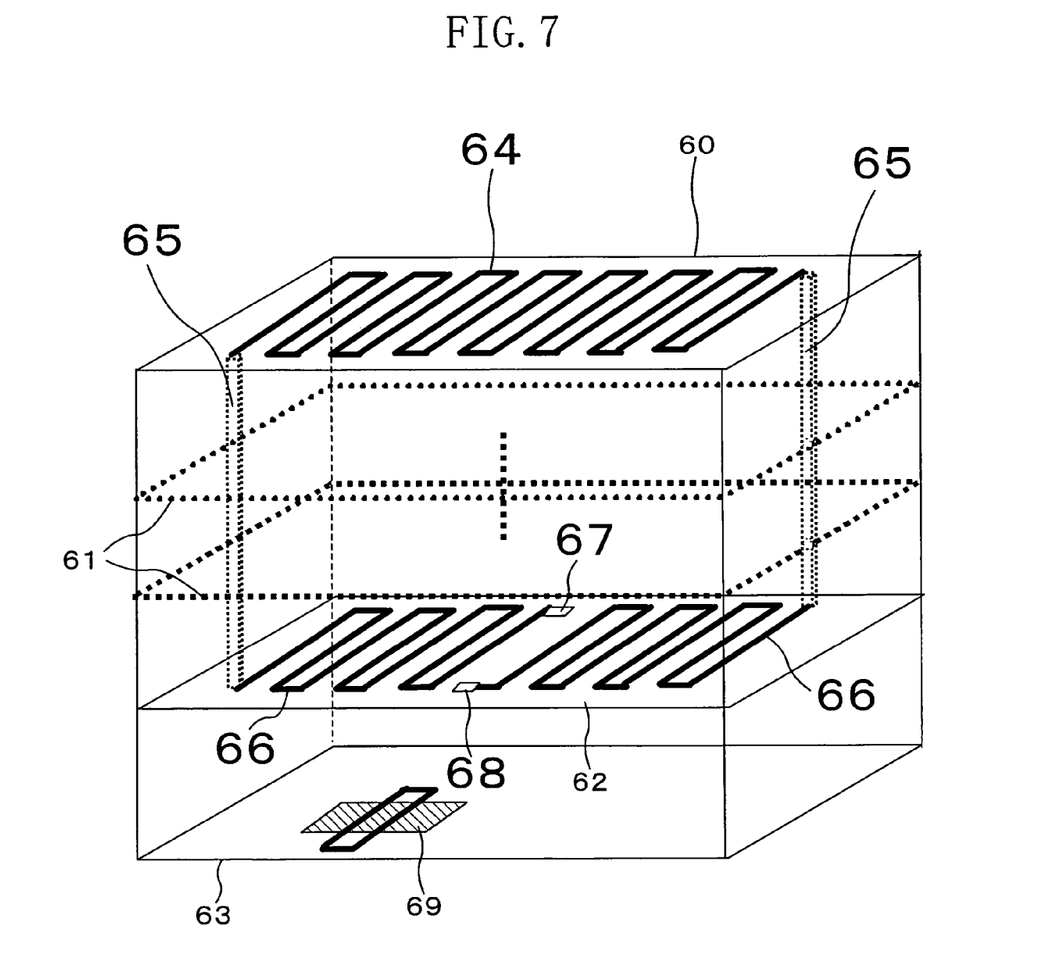
FIG. 7 is a perspective view showing in enlarged schematic form part of a semiconductor device of a first application of Embodiment 3 of the present invention.

FIG. 7 shows a semiconductor device in which emphasis is placed on the configuration of the front and back defensive wiring making full use of the advantage of the sandwich structure featuring Embodiment 3. The structure of FIG. 7 includes an uppermost wiring layer 60, circuit wiring layers 61, a lowermost wiring layer 62, an element formation layer 63, front defensive wiring 64, via contacts 65, back defensive wiring 66 and a transistor element 69. The reference numerals 67 and 68 respectively denote a start point and end point of the wiring. The front defensive wiring 64 and the back defensive wiring 66 are connected through the via contacts 65. The start and end points 67 and 68 of the route of the connected defensive wiring are placed in the lowermost wiring layer 62 from which the back defensive wiring 66 is formed. The front defensive wiring 64 and the back defensive wiring 66 may otherwise be connected with the via contacts 65 and the wiring of the middle circuit wiring layers 61 interposed therebetween.

In general, as the means of monitoring an electrical or physical property of defensive wiring to capture a change in the electrical or physical property, used are a signal generator for applying some signal, voltage or current to the start point of the monitored defensive wiring and a detector for capturing a change in the electrical or physical property at the end point of the defensive wiring. If a fraud analysis operator can locate the start and end points of the defensive wiring, he or she will be able to lead to loss of the tamper resistance of the defensive wiring by use of a means of disabling the signal generator and the detector.

In this embodiment, in which the start and end points 67 and 68 are not placed in the front defensive wiring 64, it is impossible to locate the start and end points 67 and 68 by layout observation from the front. To locate these points, the wiring layers must be peeled to reach the lowermost wiring layer 62 from which the back defensive wiring 66 is formed. Therefore, it is quite difficult to locate the start and end points of the defensive wiring and use a means of disabling the signal generator and the detector without impairing the circuit wiring network. Thus, the tamper resistance significantly improves.

Application 2 of Embodiment 3

A semiconductor device of another application of Embodiment 3 will be described. The structure of this semiconductor device is the same as that of Application 1 of Embodiment 3 described above, except for part of the configuration of the defensive wiring. Hereinafter, only the different point will be described with reference to FIG. 8.

Figure 8:
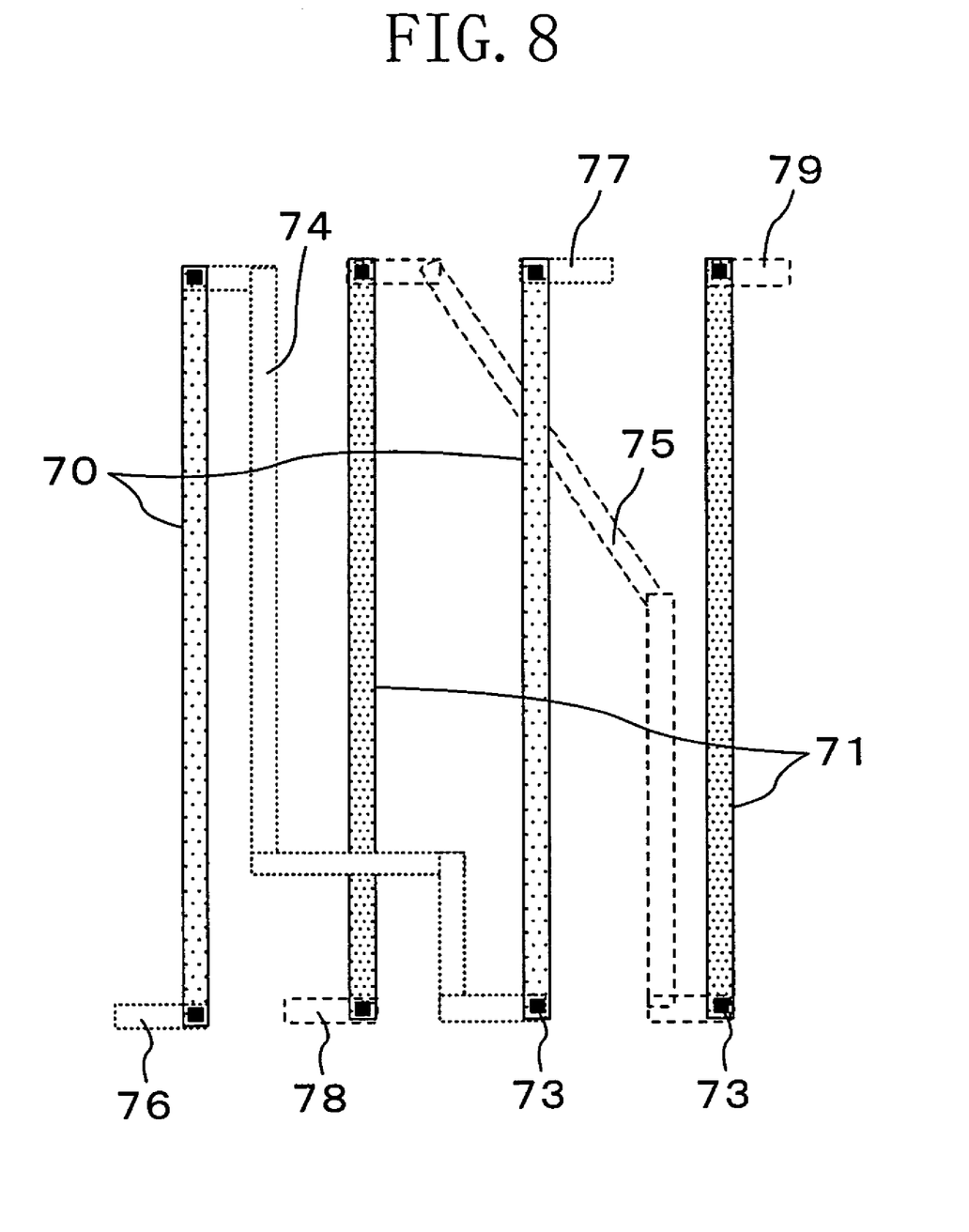
FIG. 8 is a plan view showing in enlarged schematic form part of defensive wiring of a semiconductor device of a second application of Embodiment 3 of the present invention.

Referring to FIG. 8, front defensive wiring (A) 70 and front defensive wiring (B) 71 are formed from the uppermost wiring layer 60 (see FIG. 7) as separate routes, and back defensive wiring (A) 74 and back defensive wiring (B) 75 are formed from the lowermost wiring layer 62 (see FIG. 7) as separate routes. The reference numeral 73 denotes via contacts. The back defensive wiring (A) 74 is connected to the front defensive wiring (A) 70 through via contacts 73. Likewise, the back defensive wiring (B) 75 is connected to the front defensive wiring (B) 71 through via contacts 73. The first route has its start point 76 and end point 77, while the second route has its start point 78 and end point 79. All of the points 76, 77, 78 and 79 are placed at the back defensive wiring. The front defensive wiring and the back defensive wiring may otherwise be connected with not only the via contacts 73 but also the wiring of the middle circuit wiring layers 61 (see FIG. 7) interposed therebetween.

This embodiment is characterized in not only that the start points 76 and 77 and the end points 78 and 79 of the defensive wiring are placed in the lowermost wiring layer 62 (see FIG. 7), but also that the routes of the defensive wiring, recognizable from layout observation from the front, are transposed using the circuit wiring layers 61 (see FIG. 7) and the back defensive wiring 74 and 75. This makes it further more difficult to discriminate the routes and determine the upper and lower connection relationship, and thus the tamper resistance significantly improves.

Also, a shape of simple straight-line stripes can be adopted for the front defensive wiring 70 and 71 formed from the uppermost wiring layer 60 (see FIG. 7) to cover the entire region of the semiconductor device other than input/output pad portions at the minimum wiring pitch allowable in fabrication, and yet the tamper resistance is not impaired. Therefore, the number of steps of layout design can be reduced.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor device comprising:
    one unit or a plurality of units of first defensive wiring provided above a diffusion isolation layer formed in a substrate or a well;
    a plurality of signal wiring layers formed above the first defensive wiring;
    means for applying a predetermined signal to the first defensive wiring, monitoring an electrical or physical property of the defensive wiring, capturing a change in the electrical or physical property of the first defensive wiring, and outputting a control signal in response to said change for preventing fraudulent analysis and information tampering of the semiconductor device;
    one unit or a plurality of units of second defensive wiring provided above the plurality of signal wiring layers; and
    means for applying a predetermined signal to the second defensive wiring and capturing a change in an electrical or physical property of the second defensive wiring,
    wherein the first defensive wiring is formed in the lowermost metal wiring layer.

2. The device of claim 1, further comprising:
means for erasing secret information inside the semiconductor device or shifting the mode of the semiconductor device to a fixed mode if a change in an electrical or physical property of the first defensive wiring is captured.

3. The device of claim 1, wherein the plurality of signal wiring layers comprises:
a first signal wiring layer from which first signal wiring requiring secrecy is formed; and
a second signal wiring layer placed above the first signal wiring layer, from which second signal wiring requiring no secrecy is formed,
wherein the second signal wiring is arranged to cover the first signal wiring, and
the first signal wiring layer is connected to a transistor element formed in a substrate or a well.

4. The device of claim 1, wherein the first defensive wiring is formed from a polysilicon layer used for formation of gates of transistor elements formed in the substrate or the well.

5. The device of claim 1, further comprising:
means for erasing secret information inside the semiconductor device or shifting the mode of the semiconductor device to a fixed mode if a change in an electrical or physical property of at least one of the first defensive wiring and the second defensive wiring is captured.

6. The device of claim 1, wherein a start point and an end point are placed in a layer from which the first defensive wiring is formed, and a wiring route connecting the start point and the end point is formed by combining the first defensive wiring and the second defensive wiring.

7. The device of claim 6, wherein the wiring route of the second defensive wiring recognizable by layout observation from the front of the semiconductor device is transposed using the first defensive wiring and/or the plurality of signal wiring layers.

8. A semiconductor device comprising:
transistor elements formed in a substrate or a well;
one unit or a plurality of units of first defensive wiring provided above a diffusion isolation layer formed in the substrate or the well;
a plurality of signal wiring layers formed above the first defensive wiring; and
means for applying a predetermined signal to the first defensive wiring, monitoring an electrical or physical property of the defensive wiring, capturing a change in the electrical or physical property of the first defensive wiring, and outputting a control signal in response to said change for preventing fraudulent analysis and information tampering of the semiconductor device,
wherein the first defensive wiring is formed in the lowermost metal wiring layer so as not to overlap the transistor element.

9. The device of claim 8, further comprising:
means for erasing secret information inside the semiconductor device or shifting the mode of the semiconductor device to a fixed mode if a change in an electrical or physical property of the first defensive wiring is captured.

10. The device of claim 8, wherein the plurality of signal wiring layers comprises:
a first signal wiring layer from which first signal wiring requiring secrecy is formed; and
a second signal wiring layer placed above the first signal wiring layer, from which second signal wiring requiring no secrecy is formed,
wherein the second signal wiring is arranged to cover the first signal wiring, and
the first signal wiring layer is connected to a transistor element formed in a substrate or a well.

11. The device of claim 8, wherein the first defensive wiring is formed from a polysilicon layer used for formation of gates of transistor elements formed in the substrate or the well.

12. The device of claim 8, further comprising:
one unit or a plurality of units of second defensive wiring provided above the plurality of signal wiring layers; and
means for applying a predetermined signal to the second defensive wiring and capturing a change in an electrical or physical property of the second defensive wiring.

13. The device of claim 12, further comprising:
means for erasing secret information inside the semiconductor device or shifting the mode of the semiconductor device to a fixed mode if a change in an electrical or physical property of at least one of the first defensive wiring and the second defensive wiring is captured.

* * * * *